(12) United States Patent
Shackleton et al.

(10) Patent No.: US 11,193,506 B2
(45) Date of Patent: Dec. 7, 2021

(54) PULSATION DAMPENER WITH GAS RETENTION

(71) Applicant: CANON KABUSHIKI KAISHA, Tokyo (JP)

(72) Inventors: Steven C. Shackleton, Austin, TX (US); Tyler Pearce Mann, Austin, TX (US); Christopher Pokorny, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/192,080

(22) Filed: Nov. 15, 2018

(65) Prior Publication Data
US 2020/0159112 A1    May 21, 2020

(51) Int. Cl.
*F15B 1/10*     (2006.01)
*G03F 7/16*     (2006.01)
(Continued)

(52) U.S. Cl.
CPC ............... *F15B 1/10* (2013.01); *B05C 9/08* (2013.01); *F04B 11/0016* (2013.01);
(Continued)

(58) Field of Classification Search
CPC ........ F04B 11/0016; F15B 1/021; F15B 1/10; F15B 1/106; F15B 1/12; F15B 1/125;
(Continued)

(56) References Cited

U.S. PATENT DOCUMENTS 2,339,076 A * 1/1944 Huber .................... F15B 1/106
                                                      138/30
2,563,257 A * 8/1951 Loukonen ............. F16L 55/052
                                                      138/30
(Continued)

FOREIGN PATENT DOCUMENTS

CA     2147726 A1    10/1995
JP     H08306547 A   11/1996
(Continued)

OTHER PUBLICATIONS

Laurence W. McKeen, "Introduction to Permeation of Plastics and Elastomers", Permeability Properties of Plastics and Elastomers, 2017, pp. 1-19, 4th Ed.
(Continued)

*Primary Examiner* — Robert K Arundale
*Assistant Examiner* — Richard K. Durden
(74) *Attorney, Agent, or Firm* — Canon U.S.A., Inc., IP Division (57) ABSTRACT

A pulsation dampener for a dispensing system comprising a housing, a diaphragm comprising at least one fluoropolymer layer, the diaphragm dividing the housing into a first compartment and a second compartment, an inlet port and an outlet port each in fluid communication with the first compartment thereby providing a flow path for a liquid to enter the first compartment via the first inlet port and exit the first compartment via the outlet port, and at least one gas disposed within the second compartment, the at least one gas having a kinetic diameter of 0.36 nm or greater, wherein the
(Continued)

fluoropolymer of the at least one fluoropolymer layer and the at least one gas are selected such that a gas transmittance rate of the at least one gas through the diaphragm is from 0 mbar*L/second to $1*10^{-5}$ mbar*L/second.

20 Claims, 5 Drawing Sheets

(51) Int. Cl.
   *F04B 11/00* (2006.01)
   *B05C 9/08* (2006.01)
   *F16L 55/04* (2006.01)
   *F15B 1/02* (2006.01)
   *F15B 1/12* (2006.01)
   *G03F 7/00* (2006.01)
   *B82Y 40/00* (2011.01)

(52) U.S. Cl.
   CPC ............ *F15B 1/021* (2013.01); *F15B 1/12* (2013.01); *F16L 55/04* (2013.01); *G03F 7/16* (2013.01); *B82Y 40/00* (2013.01); *F15B 2201/205* (2013.01); *F15B 2201/3151* (2013.01); *F15B 2201/3155* (2013.01); *F15B 2201/3157* (2013.01); *F15B 2201/4056* (2013.01); *F16L 55/041* (2013.01); *G03F 7/0002* (2013.01)

(58) Field of Classification Search
   CPC ............ F15B 1/14; F15B 2201/3151; F15B 2201/3155; F15B 2201/3156; F15B 2201/3157; F15B 2201/4056; F16L 55/04; F16L 55/041; F16L 55/043; F17C 2201/0185
   USPC .......................................................... 138/30
   See application file for complete search history.

(56) References Cited

U.S. PATENT DOCUMENTS

| | | | |
|---|---|---|---|
| 3,047,040 A | 7/1962 | Gross | |
| 3,856,048 A | 12/1974 | Gratzmuller | |
| 4,098,504 A | 7/1978 | Koziol et al. | |
| 4,163,461 A * | 8/1979 | Jacobellis | F16L 55/053 138/30 |
| 4,300,767 A | 11/1981 | Reed et al. | |
| 4,340,626 A | 7/1982 | Rudy | |
| 4,358,111 A | 11/1982 | Papinsick et al. | |
| 4,427,029 A * | 1/1984 | Charney | B01D 15/163 138/30 |
| 4,513,803 A | 4/1985 | Reese | |
| 5,020,644 A | 6/1991 | Novoa | |
| 5,133,387 A | 7/1992 | Pietrykowski et al. | |
| 5,171,134 A | 12/1992 | Morgart | |
| 5,227,103 A | 7/1993 | Muschiatti | |
| 5,259,487 A | 11/1993 | Petek | |
| 5,356,430 A | 10/1994 | Nadol, Jr. | |
| 5,366,048 A | 11/1994 | Watanabe et al. | |
| 5,449,003 A * | 9/1995 | Sugimura | F15B 1/10 128/830 |
| 5,578,085 A | 11/1996 | Johnson, Jr. et al. | |
| 6,016,841 A | 1/2000 | Larsen | |
| 6,098,663 A | 8/2000 | Larsen | |
| 6,350,529 B1 | 2/2002 | Germain et al. | |
| 6,457,263 B1 | 10/2002 | Rudy | |
| 7,611,429 B2 | 11/2009 | O'Neill et al. | |
| 7,918,246 B2 | 4/2011 | Stroganov | |
| 8,201,582 B2 | 6/2012 | Stroganov et al. | |
| 2004/0045615 A1* | 3/2004 | Rupp | F15B 1/106 138/30 |
| 2010/0000920 A1* | 1/2010 | Martinello | F24D 3/1016 210/137 |
| 2017/0130045 A1* | 5/2017 | Karl | C09D 9/005 |

FOREIGN PATENT DOCUMENTS

| | | |
|---|---|---|
| JP | H09264364 A | 10/1997 |
| JP | 3146392 B2 | 3/2001 |
| JP | 3596817 B2 | 12/2004 |
| JP | 2008-075537 A | 4/2008 |
| JP | 2018-006747 A | 1/2018 |

OTHER PUBLICATIONS

DuPont Teflon® Nonstick & Industrial Coatings—Teflon® Finishes in the Chemical Processing Industry, Permeation—Its Effects on Teflon® Fluoropolymer Coatings, pp. 1-12.

Laurence W. McKeen, "11: Fluoropolymers," Permeability Properties of Plastics and Elastomers, 2017, pp. 249-287, 4th Ed.

Solef® & Hylar® PVDF Polyvinylidene fluoride, Design and Processing Guide, pp. 1-72, Solvay Solexis.

* cited by examiner

PULSATION DAMPENER WITH GAS RETENTION

FIELD OF THE DISCLOSURE

The disclosure of this application relates generally to pulsation dampeners, and in particular it relates to a pulsation dampener with gas retention used in a dispensing system such as a nanoimprint lithography system.

BACKGROUND OF THE INVENTION

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the formation of a relief pattern in a formable material (polymerizable) layer and transferring a pattern corresponding to the relief pattern into and/or onto an underlying substrate. The patterning process uses a template spaced apart from the substrate and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

Certain dispensing systems, including certain nanoimprint lithography systems, include a recirculating fluid system to supply a liquid formable material to and from a dispenser. The recirculating fluid system includes a pump in the supply line to send the liquid formable material from a reservoir to the dispenser. The recirculating fluid system also includes a pump in the return line to pull the liquid formable material from the dispenser back to the reservoir. Each of the pumps introduces pulsation into the liquid formable material as a result of the pumping action. However, drop placement accuracy by the dispenser is negatively impacted by variation in the differential pressure between the supply and return lines and also variation in the meniscus pressure at the face of the dispenser. The pulsation introduced by the pumps may be mitigated via pulsation dampeners which dampen the pulsation in the liquid formable material as the liquid formable material passes through the pulsation dampeners. The longer a pulsation dampener can continue to adequately dampen pulsation in the liquid formable material, the longer the nanoimprint lithography system can continue to dispense material without the need for dampener maintenance, thereby resulting in increased productivity.

Thus, there is need in the art for a pulsation dampener that can adequately dampen pulsations in the liquid formable material for a long period of time, such as on the order of two months or more.

SUMMARY OF EXEMPLARY EMBODIMENTS

A pulsation dampener according to some example embodiments comprises a housing, a diaphragm comprising at least one fluoropolymer layer, the diaphragm dividing the housing into a first compartment and a second compartment, an inlet port and an outlet port each in fluid communication with the first compartment thereby providing a flow path for a liquid to enter the first compartment via the first inlet port and exit the first compartment via the outlet port, and at least one gas disposed within the second compartment, the at least one gas having a kinetic diameter of 0.36 nm or greater, wherein the fluoropolymer of the at least one fluoropolymer layer and the at least one gas are selected such that a gas transmittance rate of the at least one gas through the diaphragm is from about 0 mbar*L/second to about $1*10^{-5}$ mbar*L/second.

A dispensing system according to some example embodiments comprises a dispenser configured to dispense a liquid, a reservoir configured to store the liquid, one or more pumps configured to circulate the fluid between the reservoir and the dispenser, and a pulsation dampener configured to dampen pulsations in the liquid as the liquid passes through the pulsation dampener, wherein the pulsation dampener comprises: a housing, a diaphragm comprising at least one fluoropolymer layer, the diaphragm dividing the housing into a first compartment and a second compartment, an inlet port and an outlet port each in fluid communication with the first compartment thereby providing a flow path for the liquid to enter the first compartment via the first inlet port and exit the first compartment via the outlet port, and at least one gas disposed within the second compartment, the at least one gas having a kinetic diameter of 0.36 nm or greater, wherein the fluoropolymer of the at least one fluoropolymer layer and the at least one gas are selected such that a gas transmittance rate of the at least one gas through the diaphragm is from about 0 mbar*L/second to about $1*10^{-5}$ mbar*L/second.

A method of forming an article according to some example embodiments comprises pumping a formable liquid to a dispenser, dampening pulsations in the formable liquid via a pulsation dampener, the pulsation dampener comprising: a housing, a diaphragm comprising at least one fluoropolymer layer, the diaphragm dividing the housing into a first compartment and a second compartment, an inlet port and an outlet port each in fluid communication with the first compartment thereby providing a flow path for the formable liquid to enter the first compartment via the first inlet port and exit the first compartment via the outlet port, and at least one gas disposed within the second compartment, the at least one gas having a kinetic diameter of 0.36 nm or greater, wherein the fluoropolymer of the at least one fluoropolymer layer and the at least one gas are selected such that a gas transmittance rate of the at least one gas through the diaphragm is from 0 mbar*L/second to $1*10^{-5}$ mbar*L/second, dispensing a portion of the formable liquid onto a substrate, forming a pattern or a layer of the dispensed formable liquid on the substrate, and processing the formed pattern or layer to make the article.

Further features will become apparent from the following description of exemplary embodiments with reference to the attached drawings.

DESCRIPTION OF THE EMBODIMENTS

In referring to the description, specific details are set forth in order to provide a thorough understanding of the examples disclosed. In other instances, well-known methods, procedures, components and materials have not been described in detail as not to unnecessarily lengthen the present disclosure.

It should be understood that if an element or part is referred herein as being "on", "against", "connected to", or "coupled to" another element or part, then it can be directly on, against, connected or coupled to the other element or part, or intervening elements or parts may be present. In contrast, if an element is referred to as being "directly on", "directly connected to", or "directly coupled to" another element or part, then there are no intervening elements or parts present. When used, term "and/or", includes any and all combinations of one or more of the associated listed items, if so provided.

Spatially relative terms, such as "under" "beneath", "below", "lower", "above", "upper", "proximal", "distal", and the like, may be used herein for ease of description and/or illustration to describe one element or feature's relationship to another element(s) or feature(s) as illustrated in the various figures. It should be understood, however, that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, a relative spatial term such as "below" can encompass both an orientation of above and below. The device may be otherwise oriented (rotated 90 degrees or at other orientations) and the spatially relative descriptors used herein are to be interpreted accordingly.

The terms first, second, third, etc. may be used herein to describe various elements, components, regions, parts and/ or sections. It should be understood that these elements, components, regions, parts and/or sections should not be limited by these terms. These terms have been used only to distinguish one element, component, region, part, or section from another region, part, or section. Thus, a first element, component, region, part, or section discussed below could be termed a second element, component, region, part, or section without departing from the teachings herein.

The terminology used herein is for the purpose of describing particular embodiments only and is not intended to be limiting. As used herein, the singular forms "a", "an", and "the", are intended to include the plural forms as well, unless the context clearly indicates otherwise. It should be further understood that the terms "includes" and/or "including", when used in the present specification, specify the presence of stated features, integers, steps, operations, elements, and/or components, but do not preclude the presence or addition of one or more other features, integers, steps, operations, elements, components, and/or groups thereof not explicitly stated. The term "position" or "positioning" should be understood as including both spatial position and angular orientation.

In the following description, reference is made to the accompanying drawings which are illustrations of embodiments in which the disclosed invention may be practiced. It is to be understood, however, that those skilled in the art may develop other structural and functional modifications without departing from the novelty and scope of the instant disclosure.

Figure 1:
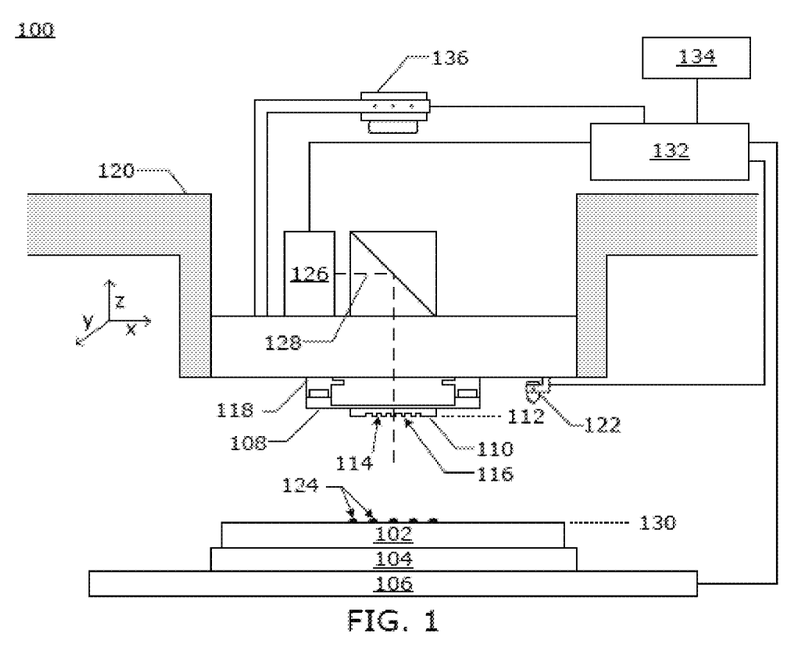
FIG. 1 is an illustration of an example nanoimprint lithography system having a template and a mold spaced apart from a substrate.

FIG. 1 is an illustration of a nanoimprint lithography system 100 in which an embodiment may be implemented. The nanoimprint lithography system 100 is used to form a relief pattern on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102. The mesa 110 may have a patterning surface 112 thereon. Alternatively, the template 108 may be formed without the mesa 110, in which case the surface of the template facing the substrate 102 is equivalent to the mold 110 and the patterning surface 112 is that surface of the template 108 facing the substrate 102.

The template 108 and/or the mold 110 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 comprises features defined by a plurality of spaced-apart template recesses 114 and/or template protrusions 116, though embodiments of the present invention are not limited to such configurations (e.g., planar surface). The patterning surface 112 defines a pattern that forms the basis of a pattern to be formed on the substrate 102. In an alternative embodiment, the patterning surface 112 is featureless in which case a planar surface is formed on the substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may be coupled to an imprint head which in turn may be moveably coupled to a bridge 120 such that the template chuck 118, the imprint head, and the template 108 are moveable in at least the z-axis direction, and potentially other directions (e.g. x, y, θ, and φ-axes). The positioning system may include one or more motors which move template 108.

Nanoimprint lithography system 100 may further comprise a fluid dispenser 122. The fluid dispenser 122 may also be moveably coupled to the bridge. In an embodiment, the fluid dispenser 122 and the template chuck 120 share one or more positioning components. In an alternative embodiment, the fluid dispenser 122 and the template chuck 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like. The liquid formable material 124 may be dispensed upon the substrate 102 before and/or after a desired volume is defined between the mold 112 and the substrate 102 depending on design considerations. The liquid formable material 124 may comprise a mixture including a monomer as described in U.S. Pat. Nos. 7,157,036 and 8,076,386, both of which are herein incorporated by reference.

Different fluid dispensers 122 may use different technologies to dispense the liquid formable material 124. When the liquid formable material 124 is jettable, ink jet type dispensers may be used to dispense the formable material. For example, thermal ink jetting, microelectromechanical systems (MEMS) based ink jetting, and piezoelectric ink jetting are common techniques for dispensing jettable liquids.

The nanoimprint lithography system 100 may further comprise an energy source 126 that directs actinic energy along an exposure path 128. The Imprint head and the substrate positioning stage 106 may be configured to position the template 108 and the substrate 102 in superimposition with the exposure path 128. A camera 136 may likewise be positioned such that an imaging field of the camera 128 is in superimposition with the exposure path 128.

The nanoimprint lithography system 100 may be regulated, controlled and/or directed by one or more processors 132 (controller) in communication with one or more components and/or subsystems such as the substrate positioning stage 106, the imprint head, the fluid dispenser 122, the source 126, and/or the camera 136 and may operate based on instructions in a computer readable program stored in a non-transitory computer readable memory 134. The processor 132 may be or include one or more of a CPU, MPU, GPU, ASIC, FPGA, DSP, and a general purpose computer. The processor 132 may be a purpose built controller or may be a general purpose computing device that is adapted to be a controller. Examples of a non-transitory computer readable memory includes but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head, the substrate positioning stage 106, or both varies a distance between the mold 110 and the substrate 102 to define a desired volume that is filled by the liquid formable material 124. For example, the imprint head may apply a force to the template 108 such that mold 110 is in contact with the liquid formable material 124. After the desired volume is filled with the liquid formable material 124, the source 126 produces energy, e.g., actinic radiation (UV), causing liquid formable material 124 to cure, solidify, and/or cross-link conforming to a shape of the substrate surface 130 and the patterning surface 112, defining a patterned layer on the substrate 102. The liquid formable material 124 is cured while the template 108 is in contact with liquid formable material 124 forming the patterned layer on the substrate 102. Thus the nanoimprint lithography system 100 uses an imprinting process to form the patterned layer which has recesses and protrusions which are an inverse of the pattern in the patterning surface 112.

The imprinting process may be done repeatedly in a plurality of imprint fields that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include fluid control features which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) above a highest point on the substrate surface 130 in each imprint field. The patterned layer may also include one or more features such as protrusions which extend above the residual layer having a thickness. These protrusions match the recesses 114 in the mesa 110.

Figure 2:
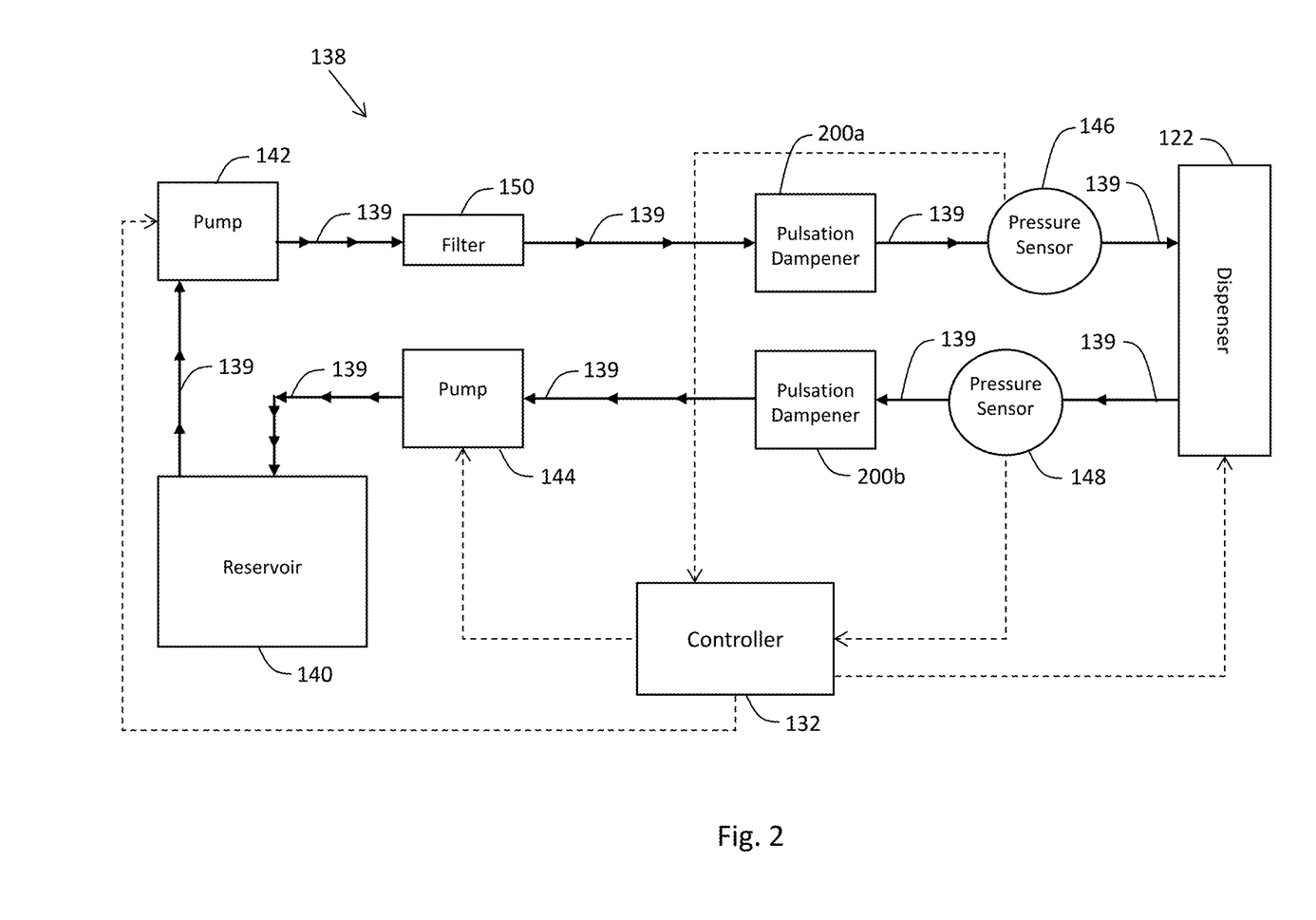
FIG. 2 is a schematic flow diagram of a recirculating fluid system of the nanoimprint lithography system of FIG. 1.

FIG. 2 is a schematic flow diagram of a recirculating fluid system 138 of the nanoimprint lithography system 100. FIG. 2 schematically illustrates the flow path of recirculating fluid system 138 where liquid formable material 124 flows from a reservoir 140 containing the liquid formable material 124 to the fluid dispenser 122 and returns from the fluid dispenser 122 to the reservoir 140 via a plurality of conduits 139. The recirculating fluid system 138 includes a first pump 142 to push fluid to the fluid dispenser 122 and a second pump 144 to return the fluid from the fluid dispenser 122 to the reservoir 140. The fluid supply system 138 may include a first pressure sensor 146 just upstream of the fluid dispenser 122 (i.e., in the flow path traveling toward the fluid dispenser 122) and a second pressure sensor 148 just downstream of the fluid dispenser 122 (i.e., in the return flow path traveling toward the reservoir 140). By measuring the pressure just upstream and just downstream of the fluid dispenser 122 the fluid supply system 138 is able to determine a differential pressure at the fluid dispenser 122 via the controller 132. The differential pressure is approximately equivalent to the meniscus pressure. The meniscus pressure can be estimated as the difference between a measured fluid pressure prior to fluid dispenser 122 and a measured fluid pressure after the fluid dispenser 122. With the differential/ meniscus pressure at the fluid dispenser 122 known from the first pressure sensor 146 and the second pressure sensor 148, the controller 132 controls the speed of each of the pumps 146, 148 to create a predetermined differential pressure between the supply and return as well as the meniscus pressure at the face of the fluid dispenser 122. Stability of the meniscus pressure at the face of the fluid dispenser 122 has direct correlation with drop placement. When a dispenser dispenses drops having a volume of less than 1 pl (picoliter), which is the case in nanoimprint lithography systems, the drop placement accuracy can begin to degrade when fluctuations of the meniscus pressure exceed ±1 mbar. More preferably, it is desirable for the fluctuations of the meniscus pressure be less than ±0.5 mbar to achieve adequate drop placement accuracy.

When the first and second pumps 142, 144 are actuated, pulsations from first and second pumps 142, 144 is introduced into the liquid formable material 124 traveling through the conduits 139 of the fluid supply system 138. As shown in FIG. 2, in order to dampen pulsations in the fluid formable material 124, the fluid supply system 138 of the nanoimprint lithography system 100 may include two pulsation dampeners 200a, 200b. One of the pulsation dampeners 200a is in the flow path of the liquid formable material 124 traveling from the reservoir 140 toward the fluid dispenser 122, while the other pulsation dampener 200b is in the flow path of the liquid formable material 124 traveling from the fluid dispenser 122 to the reservoir 140. The structure and function of the pulsation dampeners 200a, 200b are described in detail below.

During a dispensing operation described above, the nanoimprint lithography system 100 provides, via the fluid supply system 138, the liquid formable material 124 from the reservoir 140 to the fluid dispenser 122 and returns the non-dispensed liquid formable material 124 to the reservoir 140. Starting at the reservoir 140, during a dispensing operation, the first pump 142, under control of the controller 132, pumps a predetermined volume of liquid formable material 124 at a predetermined flow rate (for example about 10, 100, 150, 200, 300, 500 or 600 ml/minute) from the reservoir 140 in a direction toward the fluid dispenser 122. As noted above, the speed of the first pump 142 is controlled by the controller 132 based on the differential pressure measured by the first and second pressure sensors 146, 148. After exiting the reservoir 140 and under pressure from the first pump 142, the liquid formable material 124 passes through a filter 150. The filter 150 removes particles and bubbles generated by mechanical components (pumps, valves, etc.) of the fluid circulation system. Mechanical components such as pumps and valves tend to be the largest source of particles, as the fluid passes through these mechanical components, mechanical action can cause their surfaces to shed particles. Next, after passing through the filter 150, the liquid formable material 124 passes through the first pulsation dampener 200a. The pulsation dampener 200a dampens the pulsations in the volume of liquid formable material 124 as it passes through the pulsation dampener 200a. After exiting the first pulsation dampener 200a, with the liquid formable material 124 having been dampened, the liquid formable material 124 continues on to the fluid dispenser 122 where a precisely controlled amount of the liquid formable material 124 is dispensed.

A portion of the liquid formable material 124 that was not dispensed continues along the fluid return path to return to the reservoir 140 as a result of the pumping action imparted by the second pump 144. As noted above, the return path includes the second pressure sensor 148 which continuously provides pressure information to the controller 132 so that the controller may control first pump 142 and second pump 144 to maintain a predetermined pressure differential and/or meniscus pressure. Under pumping action from the second pump 144, being controlled by the controller 132 based on the information provided by the first and second pressure sensors 146, 148, the liquid formable material 124 enters into the second pulsation dampener 200b. As with the first pulsation dampener 200a, the second pulsation dampener 200b dampens the pulsations in the volume of liquid formable material 124 as it passes through the pulsation dampener 200b. After exiting the second dampener 200b, with the pulsations in the liquid formable material 124 having been dampened, the liquid formable material 124 continues on to the reservoir 140 where the liquid formable material 124 is combined with the liquid formable material 124 already in the reservoir. The flow cycle continues for as long as the nanoimprint lithography system 100 is in the process of dispensing.

As a result of the dampening by the first pulsation dampener 200a and the second pulsation dampener 200b, the pulsations in the liquid formable material 124 at the meniscus are reduced to ±1.0 mbar, more preferably to ±0.5 mbar.

Figure 3:
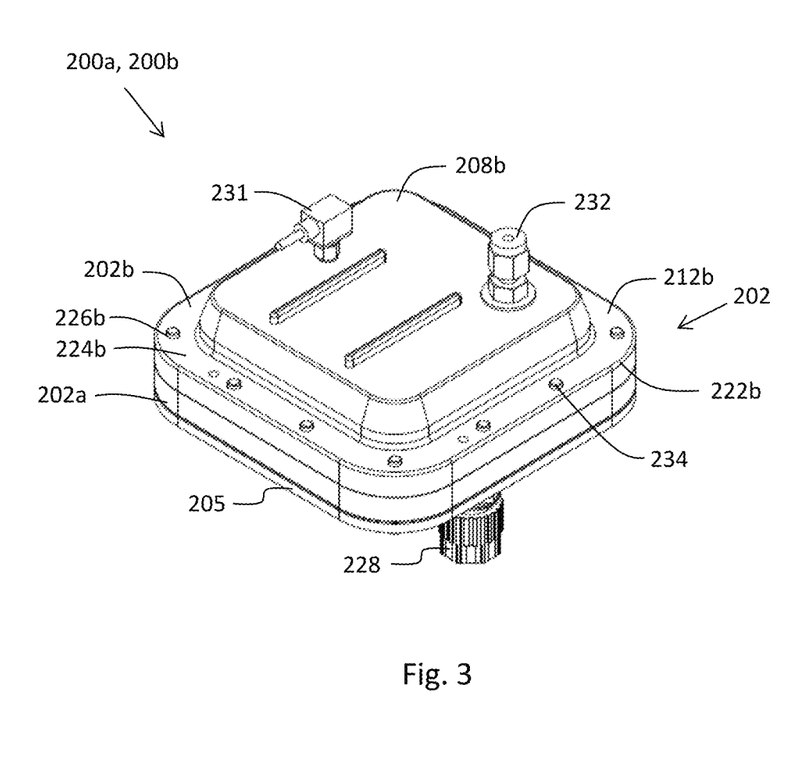
FIG. 3 is a perspective view of an example of a pulsation dampener of the of the nanoimprint lithography system of FIG. 1.
Figure 4:
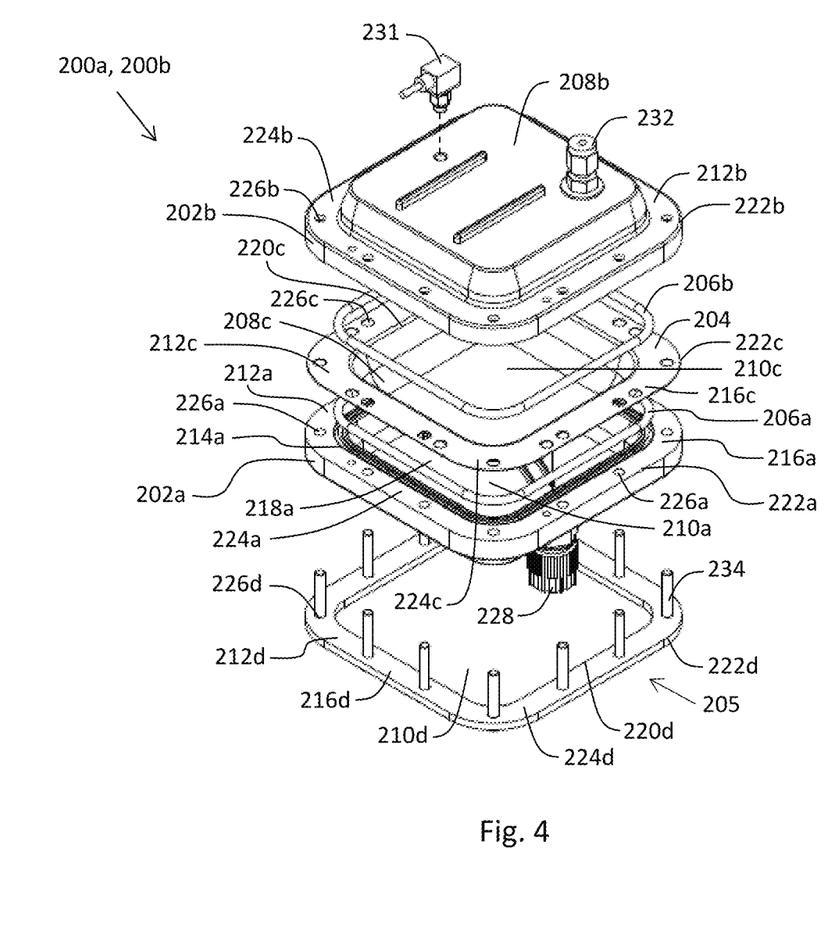
FIG. 4 is an exploded view of the pulsation dampener of FIG. 3.
Figure 5:
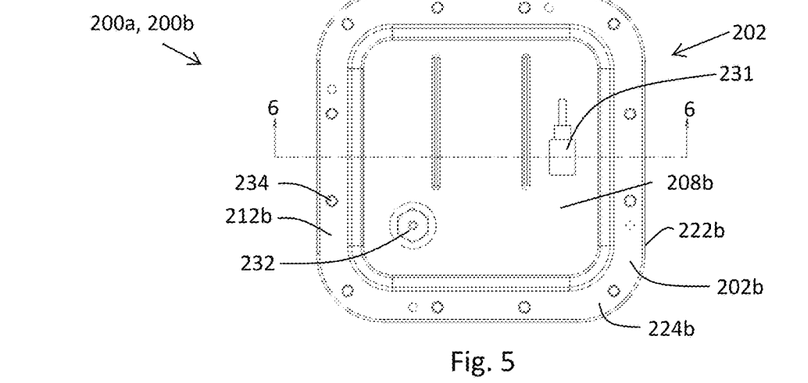
FIG. 5 is a top view of the pulsation dampener of FIG. 3
Figure 6:
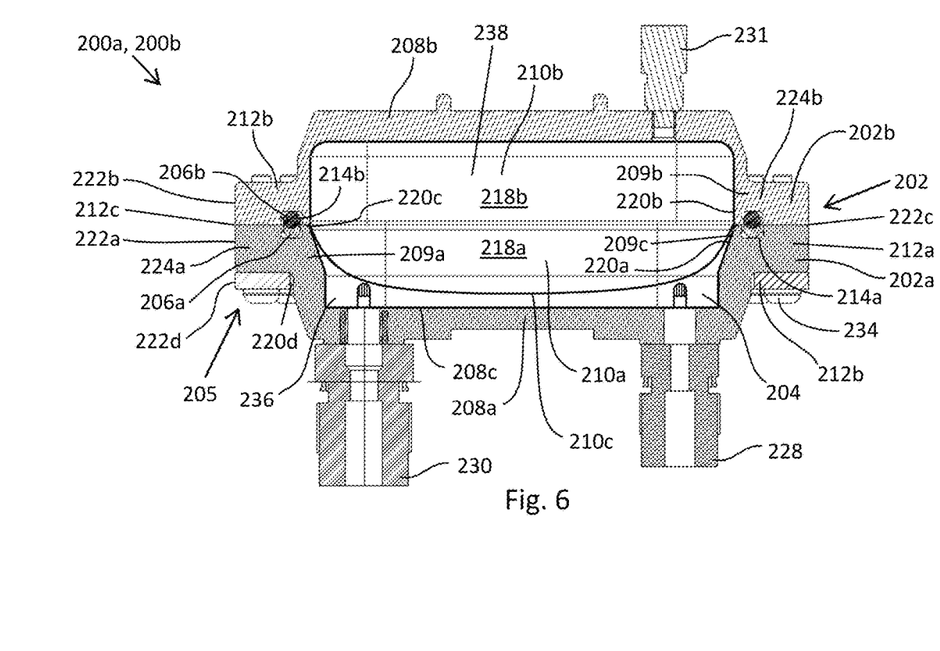
FIG. 6 is a cross-section view of the pulsation dampener of FIG. 3, as viewed along line 6-6 of FIG. 5.

Turning to the pulsation dampener 200a, 200b, FIG. 3 is a perspective view of an example embodiment of a pulsation dampener 200a, 200b. FIG. 4 is an exploded view of the pulsation dampener 200a, 200b. FIG. 5 is a top view of the pulsation dampener 200a, 200b. FIG. 6 is a cross-section view of pulsation dampener 100, as viewed as viewed along line 6-6 of FIG. 5. As indicated in the figures, each of the pulsation dampeners 200a, 200b may have the same structure. That is, the fluid supply system 138 includes two of the same pulsation dampeners. As shown in FIGS. 3 to 6, the pulsation dampener 200a, 200b may generally include a housing 202, a diaphragm 204, and one or more gaskets 206a, 206b. In the example embodiment, a first gasket 206a and a second gasket 206b are included, which may be O-rings. The gaskets may be made of a chemically resistant material such as fluoropolymer materials (e.g. perfluoroelastomer (FFKM), fluoroelastomer (FKM), expanded polytetrafluoroethylene (ePTFE), etc). In an alternative embodiment, in which the liquid formable material 124 is not chemically aggressive, other types of elastomers may be used which are suitable for the less chemically aggressive liquid formable material 124. The housing 202 may comprise a lower housing 202a and an upper housing 202b. The lower housing 202a and the upper housing 202b may be made of metallic or plastic materials. In an embodiment, the upper housing 202b may be made of stainless steel or some other material which creates a sufficient sealing surface due to its rigidity and hardness. In an embodiment, the lower housing 202a may be made of perfluoroalkoxy alkanes (PFA) or some other material that will not contaminate the liquid formable material 124. The lower housing 202a and the upper housing 202b may be secured to each other such that the diaphragm 204 is tightly clamped within the housing 202 and tightly sealed with the one or more gaskets 206a, 206b. The pulsation dampener 200a, 200b may further include a securing member 205 to achieve the seal by distributing the clamping force evenly. In an embodiment, the securing member 205 may be a stainless steel ring with multiple bolts.

As best seen in FIGS. 4 and 6, the lower housing 202a may include a base portion 208a defining a cavity 210a. The lower housing 202a may further include a lip 212a spanning the perimeter of an upper portion 209a of the base portion 208a and extending outwardly from the upper portion 209a of the base portion 208a. The lip 212a may include an inner edge 220a at the cavity 210a and an outer edge 222a. The lip 212a may include a groove 214a formed into the upper surface 216a of the lip 212a. The groove 214a may extend around the perimeter of the cavity 210a such that the groove 214a is adjacent an inner surface 218a of the cavity 210a. That is, as seen in FIGS. 4 and 6, the groove 214a may be closer to the inner edge 220a of the lip 212a than the outer edge 222a of the lip 212a.

As best seen in FIGS. 4 and 6, the inner edge 220a of the lip 212a and the outer edge 222a of the lip 212a may define an area 224a that extends from the inner edge 220a to the outer edge 222a. That is, the lip 212a includes an area 224a that extends across the width of the lip 212a. The groove 214a may be formed in this area 224a. The area 224a may include one or more through holes 226a. The through holes 226a may allow the upper housing 202b to be tightly secured to the lower housing 202a via the securing member 205, which is described in more detail below. As best seen in FIG. 4, a plurality of through holes 226a may be included in the lip 212a. For example, there may be from 2 to 20 through holes, more preferably 6 to 16 through holes, more preferably 8 to 16 through holes, more preferably 10 to 14 through holes. The number of through holes depends on the size of the pulsation dampener and the particular application. For example, a smaller pulsation dampener may have a smaller number of through holes as compared to a larger pulsation dampener that have a larger number of through holes. Thus, the number of through holes may be optimized based on the particular pulsation dampener and the particular application.

The lower housing 202a may further include an inlet port 228 in communication with the cavity 210a. The inlet port 228 provides a manner for liquid (e.g., the liquid formable material 124) outside of the housing 202 to travel via an inlet flow line (e.g, tube 139) from a liquid source (e.g. reservoir 140) into the cavity 210a. The lower housing 202a may include one more outlet ports 230 in communication with the cavity 210a. The one or more outlet ports 230 provides a manner for the liquid formable material 124 to travel from inside the cavity 210a to the dispenser 122 outside the housing 202 via an outlet flow line (e.g., tube 139).

The upper housing 202b may include features corresponding with the features of the lower housing 202a. The upper housing 202b may similarly include a base portion 208b defining a cavity 210b (FIG. 6), a lip 212b spanning the perimeter of a lower portion 209b of the base portion 208b and extending outwardly from the lower portion 209b of the base portion 208b. The lip 212b may similarly include an inner edge 220b at the cavity 210b and an outer edge 222b. The lip 212b may include a groove 214b (FIG. 6) formed into the lower surface of the lip 212b for receiving the second gasket 206b. The groove 214b may extend around the perimeter of the cavity 210b such that the groove 214b is adjacent an inner surface 218b of the cavity 210b. That is, similar to the lower housing 202a, the groove 214b of the upper housing 202b may be closer to the inner edge 220b of the lip 212b than the outer edge 222b of the lip 212b.

The inner edge 220b of the lip 212b and the outer edge 222b of the lip 212b may similarly define an area 224b that extends from the inner edge 220b to the outer edge 222b. That is, the lip 212b similarly includes an area 224b that is the width of the lip 212b. The groove of the upper housing 202b may be formed in this area 224b. The area 224b may include one or more through holes 226b. The through holes 226b may allow the upper housing 202b to be tightly secured to the lower housing 202a via a securing member 205, which will be discussed in more detail below. As shown in FIG. 4, a plurality of through holes 226b may be included in the lip 212b. For example, there may be from 2 to 20 through holes, more preferably 6 to 16 through holes, more preferably 8 to 16 through holes, more preferably 10 to 14 through holes. The placement and number of through holes 226b correspond with the placement and number of through holes 226a. The upper housing 202b may further include an inlet port 232 in communication with the cavity 210b. The inlet port 232 provides a manner for gas outside of the housing 202 to travel via an inlet flow line (not shown) from a gas source into the cavity 210b. A gas suitable for use in the pulsation dampener 200a, 200b is described in more detail below. Notably, there is no outlet port in the upper housing 202b. The upper housing 202b may include a pressure sensor 231 for measuring the pressure in the area above the diaphragm 204 (i.e., the pressure in the second compartment discussed below).

The diaphragm 204 may include features that correspond with some of the features of the lower housing 202a and the upper housing 202b. The diaphragm 204 may similarly include a base portion 208c defining a cavity 210C, a lip 212c spanning the perimeter of an upper edge of the base portion 208c and extending outwardly from the upper edge 209c of the base portion 208c. The lip 212c may similarly include an inner edge 220C at the cavity 210C and an outer edge 222c. The inner edge 220C of the lip 212C and the outer edge 222c of the lip 212c may similarly define an area 224c that extends from the inner edge 220C to the outer edge 222c. That is, the lip 212c similarly includes an area 224c that is the width of the lip 212C. The area 224c may include one or more through holes 226c (FIG. 4). The through holes 226c may allow the diaphragm 204 to be tightly secured between the upper housing 202b and the lower housing 202a, which will be discussed in more detail below. As shown in FIG. 4, a plurality of through holes 226c may be included in the lip 212C. For example, there may be from 2 to 20 through holes, more preferably 6 to 16 through holes, more preferably 8 to 16 through holes, more preferably 10 to 14 through holes. The placement and number of through holes 226c correspond with the placement and number of through holes 226a, 226b.

As best seen in FIGS. 4 and 6, the securing member 205 may include a plate 212d that defines a cavity 210d. The plate 212d may correspond in size and shape to the lips 212a, 212b, 212c of the lower housing 202a, upper housing 202b, and diaphragm 204. That is, the plate 212d may similarly include an inner edge 220d at the cavity 210d and an outer edge 222d. The inner edge 220d of the plate 212d and the outer edge 222d of the plate 212d may similarly define an area 224d that extends from the inner edge 220d to the outer edge 222d. That is, the plate 212d similarly includes an area 224d that is the width of the plate 212d. The area 224d may include one or more through holes 226d. A plurality of through holes 226d may be included in the plate 212d. For example, there may be from 2 to 20 through holes, more preferably 6 to 16 through holes, more preferably 8 to 16 through holes, more preferably 10 to 14 through holes. The placement and number of through holes 226d correspond with the placement and number of through holes 226a, 226b, 226c. The securing member 205 may further include a plurality of fasteners 234 that pass through all of the aligned holes 226a, 226b, 226c, 226d. The fastener 234 may be a bolt (secured with a nut), a screw, or the like. The holes may be threaded as necessary to receive the fasteners. Any suitable fastener known in the art may be used.

As shown in FIG. 6, the pulsation dampener 200, 200b may be assembled so that from top to bottom, the components are: the upper housing 202b, the first gasket 206a, the diaphragm 204, the second gasket 206b, the lower housing 202a, and the securing member 205. More particularly, the first gasket 206a may be positioned within the groove 214b of the lip 212b of the upper housing 202b, so that the first gasket 206a is in physical contact with the lip 212b of the upper housing 202b. The diaphragm 204 may positioned so that the first gasket 106a physically contacts the lip 212c of the diaphragm 204. Furthermore, the diaphragm 204 may be positioned such that the through holes 226c of the diaphragm 204 are aligned with the through holes 226b of the upper housing 202b. In this manner, the upper surface 216c of the lip 212c of the diaphragm 204 (i.e., the surface of the lip 212c facing the upper housing 202b) is in physical contact with the underside surface of the lip 212b of the upper housing 202b. Similarly, the second gasket 206b may be positioned within the groove of the lip 212a of the lower housing 202a, so that the gasket 206b is in physical contact with the lip 212a of the lower housing 202a. The diaphragm 204 may positioned so that the second gasket 206b physically contacts the lip 212b of the diaphragm 204. Furthermore, the diaphragm 204 may be positioned such that the through holes 226c of the diaphragm 204 are aligned with the through holes 226a of the lower housing 102a. The securing member 205 may be positioned such that the through holes 226d of the securing member 205 are aligned with the through holes 226c of the lower housing 202a.

With the above arrangement, the underside surface of the lip 212c of the diaphragm 204 (i.e., the surface of the lip 212c facing the lower housing 202a) is in physical contact with the upper surface 216a of the lip 212a of the lower housing 202a. The underside surface of the lip 212a of the lower housing 202a (i.e., the surface of the lip 212a facing the securing member 205) is in physical contact with the upper surface 216d of the securing member 205. Furthermore, with this arrangement, the through holes 226a of the lower housing 202a are aligned with the through holes 226b of the upper housing 202b. That is, each of the through holes 226a of the lower housing is aligned with a corresponding through hole 226b of the upper housing 202b and also with a corresponding through hole 226c of the diaphragm 204 and a corresponding through hole 226d of the securing mechanism 205. With all of the through holes 226a, 226c, 226d aligned, the fasteners 234 may be inserted through the aligned through holes 226a, 226b, 226c, 226d to tightly secure the diagram 204 between the lower housing 202a and the upper housing 202b. That is, with this arrangement, the diaphragm 204 can be tightly sandwiched between the lower housing 202a and the upper housing 202b, with the first gasket 206a and the second gasket 206b providing a fluid seal between on each side of the diaphragm 204. Thus, once the lower housing 202a, the diaphragm 204, and the upper housing 202b are tightly secured together via the securing member 205, there is a fluid tight seal between the diaphragm 204 and the lower housing 202a (via the second gasket 206b) and also a fluid tight seal between the diaphragm 204 and the upper housing 202a (via the first gasket 206a).

With the above-described structural arrangement of the components of the pulsation dampener 200a, 200b, the diaphragm 204 divides the housing 202 into a first compartment 236 and a second compartment 238, where the first compartment 236 is sealed from the second compartment 238. As the liquid formable material 124 fills up the first compartment 236, the volume of the first compartment increases and the volume of the second compartment decreases 238 decreases as the diaphragm 204 rises off the bottom of the lower housing base portion 208a. The lower housing base portion 208a may include guards above the inlet port for liquid 228 and the outlet port for liquid 230 that may prevent the diaphragm 204 from sealing against the lower housing base portion 208a. The pressure of the gas in the first compartment is such that the diaphragm 204 does not come into contact with bottom surface of the lower housing 202a or the top surface of the upper housing 202b. That is, the first compartment 236 is a space defined by the underside/outside surface of the diaphragm 204 and the inside surface 218a of the lower housing 202a (i.e., the area below the diaphragm 204 in FIG. 6), while the second compartment 238 is a space defined by the underside/inner surface 218b of the upper housing 202b and the upper side/inner surface of the diaphragm 204 (i.e., the area above the diaphragm 204 in FIG. 6). As best seen in FIG. 6, because the base portion 208c of the diaphragm 204 extends downwardly toward bottom of the lower housing 202a, the first compartment 236 has a significantly smaller volume that second compartment 238 when the second compartment 238 has been freshly filled with gas. For example, the ratio of the volume of the second compartment 238 to the first compartment 136 may start out at 100:1 when the second compartment 238 is freshly charged with gas. However, after several months (e.g., greater than 2 months), the ratio of the volume of the second compartment 238 to the first compartment 236 may eventually become as low as moo as more of the gas transmits through the diaphragm. When the second compartment is recharged with gas, the ratio of the volume of the second compartment 238 to the first compartment 236 would return to a ratio of 1:100.

The first compartment 136 may contain the liquid formable material 124 as it flows into and out of the first compartment 136, while the second compartment 238 may contain at least one gas described below. The liquid formable material 124 may enter the first compartment 236 via the inlet port 228 and may exit the first compartment 236 the outlet port 230. In operation, as discussed above, the liquid formable material 124 may continuously flow into and out of the first compartment 236 under the influence of the first and second pumps 142, 144. The at least one gas may be filled into the second compartment 238 via the inlet port 232 prior to operation of the dampener. The inlet port 232 may then be closed such that the at least one gas is retained in the second compartment 238. That is, during operation, while the liquid formable material 124 is continuously fed into and out of the first compartment 236, the at least one gas is not continuously fed into the second compartment 238. As discussed below in more detail, it should be understood that "at least one gas" means an embodiment in which exactly one gas is introduced into the second compartment 238 and also an embodiment in which a mixture of gases is introduced into the second compartment 238.

As the liquid formable material 124 passes through the first compartment 236, pulsations present in the liquid formable material 124 are dampened. The dampening occurs by the compression of the gas contained within the second compartment 238. Since the liquid formable material 124 is incompressible and the gas is compressible, only the second compartment 238 will absorb the pulsation. In an embodiment, the second compartment 238 is filled with a gas at a pressure that is less than the pressure of the liquid formable material 124 in the first compartment 236. In an embodiment, the second compartment 238 is initially filled with a gas at a pressure that is 80% of the pressure of the liquid formable material 124 in the first compartment 236. In an embodiment, the second compartment 238 is initially filled with a gas at a pressure that is 30% of the pressure of the liquid formable material 124 in the first compartment 236. For example, the gas may be filled in the second compartment 238 to a pressure of 17 to 18 psi absolute pressure. The pressure of the gas in the second compartment 238 may initially be above atmospheric pressure. Over time (i.e., several months), the gas will leak out the second compartment 238 and the performance of the dampener will decline in a gradual manner until diaphragm sticks to the housing at which point the dampener will no longer function to dampen pulsations in the liquid formable material 124. In a preferred embodiment, the gas in the second compartment 238 is recharged before the dampener is no longer able to dampen pulsations in the liquid formable material 124.

The composition of the diaphragm and the composition of the at least one gas may be selected such that the gas transmission rate (GTR) of the at least one gas through the diaphragm 204 is 0 mbar*L/sec to $1*10^{-5}$ mbar*L/sec, $1*10^{-15}$ mbar*L/sec to $1*10^{-6}$ mbar*L/sec, or $1*10^{-12}$ mbar*L/sec to $1*10^{-7}$ mbar*L/sec, $1*10^{-10}$ mbar*L/sec to $1*10^{-8}$ mbar*L/sec. In another embodiment the GTR may be $1.5*10^{-6}$ mbar*L/sec to $1*10^{-5}$ mbar*L/sec. For example, in one example aspect, the GTR of the at least one gas through the diaphragm 204 is $1*10^{-5}$ mbar*L/sec. The term "gas transmission rate," as used herein, means the quantity of the gas passing through a unit of the parallel surfaces of the diaphragm in unit time. A preferred method for determining the GTR of the at least one gas through the diaphragm is as follows. First, a 1"×1" section in the center of the base portion 208a of the pulsation dampener 200 is removed such that diaphragm 204 is exposed. The thickness of the diaphragm may be measured using a micrometer at the center of the membrane. Next, all of the components of the pulsation dampener are rinsed with ultra-pure water for three minutes and dried with semiconductor grade isopropyl alcohol. The ultra pure water should have a specific resistance of be at 15 MΩ*cm or higher. Then, the second compartment 238 is evacuated to an absolute pressure of 11.7 psi. Because the diaphragm 204 is flexible it will collapse during the evacuation step, thus evacuating most of the air (i.e., 99% or greater) from the second compartment 238. Next, the second compartment 238 is filled with the gas or gas mixture to a pressure of 17.7 psi absolute pressure. The volume of the gas in the second compartment 238 will be approximately 99% or greater of the gas or mixture of gas, the remaining volume of the second compartment 238 being air. Then, a gas-specific leak detector is used to verify that the gas or mixture of gases is not leaking out of any areas other than the diaphragm. Next, the leakage of the gas or mixture of gases is measured at the 1"×1" section using the gas-specific leak detector. The gas-specific leak detector may be any suitable detector known in the art that is configured to detect the particular gas of interest. For example, the gas-specific leak detector may be nuclear magnetic resonance (NMR) spectroscopy, hollow cathode lamp spectroscopy, infrared or ultraviolet (UV) spectroscopy, thermal conductivity, electrochemical, photoionization, etc. The devices should have a minimum gas detection of $5\times10^{-7}$ L*mbar/sec. The environmental conditions during the testing are 23° C., 14.7 psi absolute atmospheric pressure, and 50% relative humidity. When a mixture of gases is used, a detector capable of measuring each of the gases simultaneously may be used or multiple gas detectors may be used where each gas detector detects a particular gas. The measured leakage informs the GTR value.

It should be understood that the GTR being tested under the above conditions does not mean that the pulsation dampener must be operated under these conditions when used in a dispensing system to satisfy the above-listed GTR value. Rather, it should be understood that that the above-listed GTR value is satisfied if the particular combination of gas and diaphragm, when tested under the above-described procedures, provides the above-listed GTR values, regardless of the particular thickness of the diaphragm, particular operating temperature, particular operating pressure, particular relative humidity, etc. For example, a particular pulsation dampener being used in a particular dispensing system may comprise a gas in combination with a diaphragm, operate at 30° C., 16 psi, 75% relative humidity, etc. The GTR may fall outside the above-provided GTR values under these conditions. However, if one were to test the GTR of the same gas through the same diaphragm following the above-described testing procedure, and the GTR is found to fall within the above-provided GTR value, then the above-listed GTR values is nevertheless satisfied. That is, in this hypothetical example, the pulsation dampener would still satisfy the above GTR values despite having a different GTR when used in a dispensing system.

A pulsation dampener having the above-provided GTR provides a distinct advantage over conventional pulsation dampeners, in particular when the pulsation dampener is used in the nanoimprint lithography system 100 to dampen fluctuations in the pressure of the liquid formable material 124 traveling through the first compartment 236. When printing with the nanoimprint lithography system 100 using a pulsation dampener 200a, 200b, it is desirable for the pulsation dampener to limit fluctuations in the meniscus pressure of the liquid formable material 124 to be less than ±1 mbar, more preferably ±0.5 mbar. If the pulsation dampener loses too much gas through the diaphragm, the pulsation dampener can no longer operate to keep the pressure fluctuations in the liquid formable material to be less than ±1 mbar or more preferably less than ±0.5 mbar. This happens because as the gas exits the second compartment 238, the dampening capability decreases until there is no more gas in the second compartment 238 to perform the dampening process. The diaphragm will eventually contact the inner surface of the upper housing and will act as a rigid volume. Accordingly, as gas exits the housing, the dampening capability continuously decreases until the dampener can no longer function entirely after the diaphragm contacts the upper housing. As noted above, if the pulsation dampener is not able to limit the pressure fluctuations to less than ±1 mbar or more preferably less than ±0.5 mbar, then the placement accuracy of the drops in nanoimprint lithography system (i.e., where the volume of the drops are less than 1 picoliter) degrades beyond an acceptable performance level. With the above-listed GTR values, the gas very slowly passes through the diaphragm 204. That is, the gas is highly retained within the second compartment 238. Over time, gas will inevitably pass through the diaphragm. However, as compared to a pulsation dampener where the GTR of the gas through a diaphragm is much higher, the gas will pass through the diaphragm at a much higher rate. For example, in pulsation dampener with a GTR of greater than $1*10^{-5}$ mbar*L/sec, a critical amount of gas will pass through the diaphragm within one month of filling the gas into the compartment, in particular when the pulsation dampener is used in a nanoimprint lithography system. Once a critical amount of gas is passed through the diaphragm, the pulsation dampener can no longer limit the meniscus pressure fluctuations in the fluid to less than ±1 mbar or more preferably less than ±0.5 mbar. That is, the operator of a nanoimprint lithography system will have to refill the compartment with fresh gas about every one month in order for the pulsation dampener to continue to adequately function. However, with the above-listed GTR value of the gas through the diaphragm, the pulsation dampener can continue to function to prevent fluctuations in pressure of liquid formable material 124 traveling through the first compartment to be less than ±1 mbar or more preferably less than ±0.5 mbar for two months or more, even up to a year or two years. Thus, the reduced GTR allows the operator to operate the nanoimprint lithography system 100 and maintain adequate drop placement accuracy for double the amount of time or more before needing to replenish the gas in the second compartment 138.

The above-noted GTR value of the at least one gas through the diaphragm 204 may be achieved by selecting the appropriate composition of the diaphragm and selecting an appropriate composition of gas to be used in combination with each other. That is, the passing of the gas through the diaphragm 204 depends on both the composition of the diaphragm and the composition of the gas.

The at least one gas preferably has a kinetic diameter of 0.36 nm or greater, more preferably 0.38 nm or greater, more preferably 0.40 nm or greater, more preferably 0.45 nm or greater, more preferably 0.50 nm or greater. An upper limit for the kinetic diameter may be 0.60 nm for each of these ranges. For example, the gas may have a kinetic diameter of 0.396 nm in one example embodiment or may have a kinetic diameter of 0.55 nm in another example embodiment. When the at least one gas comprises a plurality gasses (i.e., the at least one gas is a mixture of gases), the kinetic diameter of each of the gases may have the above-noted kinetic diameter. The gas preferably has other properties that do not directly impact the GTR of the gas. The gas is preferably inert. The gas preferably does not interact with or alter the composition of the liquid formable material passing through the pulsation dampener. The gas preferably does not react with or alter the composition of the components of the pulsation dampener including upper and lower housings and the gaskets. The gas is preferably non-flammable and not an asphyxiant. In some cases it is preferable that the gas is not a greenhouse gas, when environmental concerns are relevant.

The at least one gas may be selected from the group consisting of xenon (Xe), sulfur hexafluoride ($SF_6$), nitrogen ($N_2$), carbon monoxide (CO), methane ($CH_4$), etheylene ($C_2H_4$), propane ($C_3H_8$), n-butane ($C_4H_{10}$), difluorodichloromethane ($CF_2Cl_2$), propene ($C_3H_6$), tetrafluoromethane ($CF_4$), i-butane ($C_4H_{10}$), krypton (Kr), benzyne ($C_6H_6$), carbon tetrachloride ($CCl_4$), octafluoropropane ($C_3F_8$), benzene ($C_6H_6$), and mixtures thereof. The at least one gas more preferably is selected from the group consisting of Xe, $SF_6$, $N_2$ and mixtures thereof.

The second compartment 238 may comprise exactly one of the above-noted gases or any mixture of the above-gases. That is, the term "at least one gas" means that exactly one gas can be used, but any combination of gases may also be used. Based on the total available volume of the second compartment 238, the content of the gas within the second compartment 238 may be at least 10% by volume of the gas or mixture of the gases, more preferably at least 30% by volume of the gas or mixture of the gases, more preferably at least 50% by volume of the gas or mixture of the gases, more preferably at least 75% by volume of the gas or mixture of the gases, more preferably at least 90% by volume of the gas or mixture of the gases, more preferably at least 95% by volume of the gas or mixture of the gases, more preferably at least 99% by volume of the gas or mixture of the gases, and more preferably 100% (or as close as possible) by volume of the gas or mixture of the gases. When the gas takes up less than 100% of the volume of the second compartment 238, the remaining volume of the second compartment 238 may be air.

In one example aspect at least 10% by volume of the total volume of the second compartment 238 may be Xe, more preferably at least 30% by volume of the total volume of the second compartment 238 may be Xe, more preferably at least 50% by volume of the total volume of the second compartment 238 may be Xe, more preferably at least 75% by volume of the total volume of the second compartment 238 may be Xe, more preferably at least 90% by volume of the total volume of the second compartment 238 may be Xe, more preferably at least 95% by volume of the total volume of the second compartment 238 may be Xe, and more preferably at least 99% by volume of the total volume of the second compartment 238 may be Xe, and more preferably 100% (or as close as possible) by volume of the total volume of the second compartment 238 may be Xe. The remaining volume in the second compartment 238 for each of these examples may be any other gas of the above-noted gases or any mixture of the above noted gases. For example, the remaining volume of gas may be $N_2$. In another aspect, the remaining volume may be air.

In another example aspect at least 10% by volume of the total volume of the second compartment 238 may be $SF_6$, more preferably at least 30% by volume of the total volume of the second compartment 238 may be $SF_6$, more preferably at least 50% by volume of the total volume of the second compartment 238 may be $SF_6$, more preferably at least 75% by volume of the total volume of the second compartment 238 may be $SF_6$, more preferably at least 90% by volume of the total volume of the second compartment 238 may be $SF_6$, more preferably at least 95% by volume of the total volume of the second compartment 238 may be $SF_6$, and more preferably at least 99% by volume of the total volume of the second compartment 238 may be $SF_6$, and more preferably 100% (or as close as possible) by volume of the total volume of the second compartment 238 may be $SF_6$. The remaining volume in the second compartment 238 for each of these examples may be any other gas of the above-noted gases or any mixture of the above noted gases. For example, the remaining volume of gas may be $N_2$. In another aspect, the remaining volume may be air.

In one example aspect at least 90% by volume of the total volume of the second compartment 238 may be $N_2$, more preferably at least 95% by volume of the total volume of the second compartment 238 may be $N_2$, more preferably at least 98% by volume of the total volume of the second compartment 238 may be $N_2$, more preferably at least 99% by volume of the total volume of the second compartment 238 may be $N_2$, and more preferably 100% (or as close as possible) by volume of the total volume of the second compartment 238 may be $N_2$. The remaining volume in the second compartment 238 for each of these examples may be any other gas of the above-noted gases or any mixture of the above noted gases. For example, the remaining volume of gas may be air.

When mixtures of gases are used it should be understood that the above-provided GTR value describes the entire mixture of gases. In particular, the GTR value of a mixture of gases represents a weighted average, by volume, of each individual gas in the mixture. For example, if the at least one gas is a mixture of 50% Xe, 25% $SF_6$, and 25% $N_2$, then the GTR value of the overall mixture is the weighted average of the GTR of each of the individual gases based on their relative volume in the mixture (i.e., in this example, the GTR of Xe would be weighted by factor of 0.5, the GTR of the $SF_6$ would be weighted by a factor of 0.25, and the GTR of $N_2$ would be weighted by a factor of 0.25 when determining the average GTR). Thus, the above-provided GTR values represents both individual gases and mixtures of gases.

When filling the second compartment 238 with the at least one gas, second compartment may first be evacuated before filling the second compartment 238. After evacuating the second compartment 238, the at least one gas may then be filled into the second chamber 238. The evacuation pressure and the gas filling pressure may be selected to achieve a desired pressure and quantity of gas in the second compartment 238. For example, the second compartment 238 may be evacuated to an absolute pressure of 11.7 psi and the gas may be filled to an absolute pressure of 17.7 psi in order to achieve 99% or greater volume of the gas in the second compartment.

The diaphragm 204 may have a composition such that, when the diaphragm 204 is used in combination with the gas, the combination results in the above-listed GTR of the gas through the diaphragm. In particular, the diaphragm may comprise at least one fluoropolymer layer. That is, the diaphragm 204 may comprise a multilayer structure in which at least one of the layers may be made of/consist of a fluoropolymer. The multilayer structure may include a plurality of layers (e.g., 2, 3, 4 etc. or more layers) in which one or all of the layers is made of/consists of the fluoropolymer. In another aspect the "at least one" fluoropolymer layer may be the only layer of the diaphragm 204. In other words, it should be understood that "at least one" encompasses exactly one layer. That is, the diaphragm 204 may be made of a single uniformly molded structure that consists essentially of or consists of the fluoropolymer.

The fluoropolymer may be selected from the group consisting of polyvinylidene fluoride (PVDF), polyvinyl fluoride (PVF), fluorinated ethylene propylene (FEP), perfluoroalkoxy (PFA), polytetrafluoroethylene (PTFE), polychlorotrifluoroethylene (PCTFE), ethylene tetrafluoroethylene (ETFE), and mixtures thereof. More preferably, the fluoropolymer may be selected from the group consisting of PVDF, PFA, PTF, PCTFE, and mixtures thereof. In one example aspect, the fluoropolymer is PVDF.

The composition of the diaphragm may also be selected such that the material has a metal ion cleanliness of less than 2 parts-per-billion (ppb) under the following metal ion cleanliness testing method. A 1 inch by 1 inch sample of a material is prepared having a uniform thickness. The sample is rinsed with ultra-pure water (water having a maximum individual metal of anion impurity levels of 0.1 ppb by weight or specific resistivity of 18 meghohm*cm or greater) for three minutes. A control container made of PFA and a testing container made of PFA each having an internal volume of 200 ml are acquired. The sample is placed in the test container. Both the test container and the control container are filled with 200 ml of 1% nitric acid, the balance being ultra-pure water. The sample is fully submerged. The sample is soaked for one hour at 23° C., 14.7 psi absolute pressure, and 50% relative humidity. 50 ml of the fluid are extracted from each of the test container and the control container. The extracted fluids are each tested for Al, Ca, Cr, Cu, Fe, Pb, Li, Mg, Mn, Ni, K, Na, Sn, or Zn ions contained in the fluid using inductively coupled plasma mass spectrometry (ICP-MS) analysis. The control sample is used to confirm the accuracy of the test. If the sample fluid contains less than 2 ppb of the ions, then the material has a satisfactory metal ion cleanliness.

The above-listed fluoropolymers, when used in combination with the above-listed gas, provide the above-listed GTR value. However, other materials can be used for the diaphragm by adding impediments to gas transmission. One example option that decreases the gas transmission through a material is metallizing. Metallizing is process known in the art where a thin film of metal (e.g., 100 to 250 angstroms thick) is deposited onto another material. In this case, materials that would not otherwise provide the above-listed GTR when used in combination with the above-listed gases can nevertheless provide the above-noted GTR after being metallized. The metal may be selected from the group consisting of aluminum, nickel, and chromium. Preferably the metal is aluminum. The thickness of the metal layer deposited may be 100 to 250 angstroms. The metal layer may be deposited onto a surface of the diaphragm. In one example embodiment, only the surface of the diaphragm facing the upper housing (i.e., the surface of the diaphragm facing the gas) may be metallized. In this case the surface of the diaphragm facing the lower housing is not metallized because the metal would be in contact with the liquid formable material flowing through the first compartment. This arrangement avoids a potential reaction between the metal and the liquid. However, the surface of the diaphragm facing the lower housing may be metallized if the metal is non-reactive with the liquid formable material. When a surface of the diaphragm is metallized, the material of the diaphragm may be selected from the group consisting of PVDF, PVF, FEP, PFA, PTFE, high density polyethylene (HDPE), nylon, and polypropylene.

The diaphragm 204, whether multilayer or a single layer, may have a total thickness of 10 μm to 500 μm, 20 μm to 300 μM, 50 μm to 200 μm, or 80 μm to 150 μm. The selected thickness may be optimized based on the modulus of elasticity of the particular materials of the diaphragm. While a thicker diaphragm assists in decreasing the GTR of the gas through the diaphragm, an overly thick diaphragm will not optimally dampen the pulsations in the liquid. A single layer of PVDF may have a thickness of 50 to 400 μm. A single layer of PFA may have a thickness of 50 to 400 μm. A single layer of PTFE may have a thickness of 50 to 400 μm. A single layer of PCTFE may have a thickness of 40 to 300 μm. A single layer of PVF may have a thickness of 40 to 300 μm. A single layer of FEP may have a thickness of 50 to 400 μm. In a multilayer diaphragm, the fluoropolymer layer of the multilayer structure may be 10 μm to 100 μm, 15 μm to 50 μm, or 18 μm to 25 μm. For example, the fluoropolymer layer may be 20 μm.

As discussed above, the pulsation dampeners 200*a*, 200*b* may be used in the nanoimprint lithography system 100 to dampen vibrations in the liquid formable material 124 caused by the action of the pumps 142, 144. Thus, a method of making an article from the liquid formable material 124 may include using the above-described pulsation dampener 200*a*, 200*b* in the article manufacturing method described above. That is, the method may include formation of a relief pattern or a planar layer of the liquid formable material 124 using a template. And the method may include transferring a pattern corresponding to the relief pattern into and/or onto the underlying substrate 102. The formation includes using the template 108 spaced apart from the substrate 102 and the liquid formable material 124 is applied between the template 108 and the substrate 102 via the dispenser 122. The liquid formable material 124 may travel to and from the dispenser 122 and may be dampened by the pulsation dampeners 200a, 200b as discussed above under the control of the controller 132. The liquid formable material 124 may then be solidified to form a solid layer that has a pattern conforming to a shape of the surface of the template 108 that is in contact with the liquid formable material. After solidification, the template 108 is separated from the solidified layer such that the template 108 and the substrate 102 are spaced apart. The substrate 102 and the solidified layer are then subjected to additional processes, such as etching processes, to transfer a relief image into the substrate that corresponds to the pattern in the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like. Additional details of the manufacturing method are found above in the discussion of FIG. 1. It should be understood that the pulsation dampeners 200a, 200b described herein can be used in any known article manufacturing method in which dampening of the pulsations in the fluid being dispensed is desired, such as in the above-described nanoimprint lithography system 100.

EXAMPLES

Example 1

The pulsation dampener shown in FIGS. 3-6 where the diaphragm is a single 125 μm thick layer of 100% PVDF. The second compartment is evacuated and then filled with Xe gas such that substantially 100% of the second compartment volume is filled with the Xe gas, the remaining volume being air.

Example 2

The pulsation dampener shown in FIGS. 3-6 where the diaphragm is a single 125 μm thick layer of 100% PVDF. The second compartment is evacuated and then filled with $SF_6$ such that substantially 100% of the second compartment volume is filled with the $SF_6$ gas, the remaining volume being air.

Example 3

The pulsation dampener shown in FIGS. 3-6 where the diaphragm is a single 125 μm thick layer of 100% PVDF. The second compartment is evacuated and then filled with a mixture of 75% Xe gas and 25% nitrogen gas such that substantially 100% of the second compartment volume is filled with the gas mixture, the remaining volume being air.

Example 4

The pulsation dampener shown in FIGS. 3-6 where the diaphragm is a single 125 μm thick layer of 100% PVDF. The second compartment is evacuated and then filled with a mixture of 75% $SF_6$ gas and 25% nitrogen gas such that substantially 100% of the second compartment volume is filled with the gas mixture, the remaining volume being air.

Example 5

The pulsation dampener shown in FIGS. 3-6 where the diaphragm is a single 125 μm thick layer of 100% PVDF. The second compartment is evacuated and then filled with a mixture of 50% $SF_6$ gas and 50% Xe gas such that substantially 100% of the second compartment volume is filled with the gas mixture, the remaining volume being air.

Example 6

The pulsation dampener shown in FIGS. 3-6 where the diaphragm is a single 125 μm thick layer of 100% PVDF. The second compartment is evacuated and then filled with Xe gas such that 75% of the second compartment volume is filled with Xe gas, the remaining volume being air.

Example 7

The pulsation dampener shown in FIGS. 3-6 where the diaphragm is a single 125 μm thick layer of 100% PVDF. The second compartment is evacuated and then filled with $SF_6$ gas such that 75% of the second compartment volume is filled with the $SF_6$ gas, the remaining volume being air.

Example 8

The pulsation dampener shown in FIGS. 3-6 where the diaphragm is a single 125 μm thick layer of 100% PVDF. The second compartment is evacuated and then filled with $N_2$ gas such that 95% of the second compartment volume is filled with the $N_2$ gas, the remaining volume being air.

Example 9

The pulsation dampener shown in FIGS. 3-6 where the diaphragm is a single 125 μm thick layer of 100% PVDF. The second compartment is evacuated and then filled with a mixture of 50% $SF_6$ gas and 50% Xe gas such that 75% of the second compartment volume is filled with the gas mixture, the remaining volume being air.

Example 10

The pulsation dampener shown in FIGS. 3-6 where the diaphragm is a single 125 μm thick layer of 100% PFA. The second compartment is evacuated and then filled with Xe gas such that substantially 100% of the second compartment volume is filled with the Xe gas, the remaining volume being air.

Example 11

The pulsation dampener shown in FIGS. 3-6 where the diaphragm is a single 125 μm thick layer of 100% PFA. The second compartment is evacuated and then filled with $SF_6$ such that substantially 100% of the second compartment volume is filled with the $SF_6$ gas, the remaining volume being air.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A pulsation dampener for a dispensing system, comprising:
   a housing;
   a diaphragm comprising at least one fluoropolymer layer, the diaphragm dividing the housing into a first compartment and a second compartment;

an inlet port and an outlet port each in fluid communication with the first compartment thereby providing a flow path for a liquid to enter the first compartment via the first inlet port and exit the first compartment via the outlet port; and at least one gas selected from the group consisting of xenon, sulfur hexafluoride, and mixtures thereof, wherein the fluoropolymer of the at least one fluoropolymer layer is selected from the group consisting of polyvinylidene fluoride (PVDF), polyvinyl fluoride (PVF), fluorinated ethylene propylene (FEP), perfluoroalkoxy (PFA), polytetrafluoroethylene (PTFE), polychlorotrifluoroethylene (PCTFE), and ethylene tetrafluoroethylene (ETFE), wherein the diaphragm has a thickness of 10 μm to 500 μm, and wherein the fluoropolymer of the at least one fluoropolymer layer, the at least one gas, and the thickness of the diaphragm are selected such that a gas transmittance rate of the at least one gas through the diaphragm is from 0 mbar*L/second to $1*10^{-5}$ mbar*L/second.

2. The pulsation dampener of claim 1, wherein the fluoropolymer of the at least one fluoropolymer layer, the at least one gas, and the thickness of the diaphragm are selected such that the gas transmittance rate of the at least one gas through the diaphragm is from $1.5*10^{-6}$ mbar*L/second to $1*10^{-5}$ mbar*L/second.

3. The pulsation dampener of claim 1, wherein the at least one gas is a mixture of xenon and sulfur hexafluoride.

4. The pulsation dampener of claim 1, wherein the fluoropolymer of the at least one fluoropolymer layer is polyvinylidene fluoride.

5. The pulsation dampener of claim 1, wherein the at least one gas is xenon.

6. The pulsation dampener of claim 1, wherein the fluoropolymer of the at least one fluoropolymer layer is polyvinylidene fluoride and the at least one gas is xenon.

7. The pulsation dampener of claim 1, wherein the diaphragm consists of the at least one fluoropolymer layer.

8. The pulsation dampener of claim 7, wherein the at least one gas consists of xenon and wherein the second compartment comprises at least 75% by volume of the xenon.

9. The pulsation dampener of claim 1,
wherein the housing comprises an upper housing and a lower housing, and
wherein a portion of the diaphragm is sandwiched between a portion of the upper housing and a portion of the lower housing.

10. The pulsation dampener of claim 9, further comprising:
a first gasket disposed between the portion of the upper housing and the portion of the diaphragm; and
a second gasket disposed between the portion of the diaphragm and the portion of the lower housing.

11. The pulsation dampener of claim 10, further comprising a securing member surrounding the portion of the lower housing or the portion of the upper housing, the securing member configured to seal the portion of the diaphragm between the portion of the lower housing and the portion of the upper housing via the first and second gaskets.

12. The pulsation dampener of claim 1, further comprising a gas inlet port in fluid communication with the second compartment.

13. The pulsation dampener of claim 1, wherein the at least one fluoropolymer layer comprises a plurality of fluoropolymer layers.

14. The pulsation dampener of claim 13, wherein each layer of the plurality of fluoropolymer layers is selected from the group consisting of polyvinylidene fluoride (PVDF), polyvinyl fluoride (PVF), fluorinated ethylene propylene (FEP), perfluoroalkoxy (PFA), polytetrafluoroethylene (PTFE), polychlorotrifluoroethylene (PCTFE), and ethylene tetrafluoroethylene (ETFE).

15. The pulsation dampener of claim 13, wherein each layer of the plurality of fluoropolymer layers has a thickness of 10 μm to 100 μm.

16. The pulsation dampener of claim 1, further comprising a metal film on the diaphragm.

17. The pulsation dampener of claim 16, wherein the metal film has a thickness of 100 to 250 angstroms.

18. The pulsation dampener of claim 16, wherein the metal film is selected from the group consisting of aluminum, nickel, and chromium.

19. A dispensing system, comprising:
a dispenser configured to dispense a liquid;
a reservoir configured to store the liquid;
one or more pumps configured to circulate the liquid between the reservoir and the dispenser; and
a pulsation dampener configured to dampen pulsations in the liquid as the liquid passes through the pulsation dampener,
wherein the pulsation dampener comprises:
a housing;
a diaphragm comprising at least one fluoropolymer layer, the diaphragm dividing the housing into a first compartment and a second compartment;
an inlet port and an outlet port each in fluid communication with the first compartment thereby providing a flow path for the liquid to enter the first compartment via the first inlet port and exit the first compartment via the outlet port; and
at least one gas disposed within the second compartment, the at least one gas being selected from the group consisting of xenon, sulfur hexafluoride, and mixtures thereof,
wherein the fluoropolymer of the at least one fluoropolymer layer is selected from the group consisting of polyvinylidene fluoride (PVDF), polyvinyl fluoride (PVF), fluorinated ethylene propylene (FEP), perfluoroalkoxy (PFA), polytetrafluoroethylene (PTFE), polychlorotrifluoroethylene (PCTFE), and ethylene tetrafluoroethylene (ETFE),
wherein the diaphragm has a thickness of 10 μm to 500 μm, and
wherein the fluoropolymer of the at least one fluoropolymer layer, the at least one gas, and the thickness of the diaphragm are selected such that a gas transmittance rate of the at least one gas through the diaphragm is from 0 mbar*L/second to $1*10^{-5}$ mbar*L/second.

20. A method of making an article, comprising:
pumping a formable liquid to a dispenser;
dampening pulsations in the formable liquid via a pulsation dampener, the pulsation dampener comprising:
a housing;
a diaphragm comprising at least one fluoropolymer layer, the diaphragm dividing the housing into a first compartment and a second compartment;
an inlet port and an outlet port each in fluid communication with the first compartment thereby providing a flow path for the formable liquid to enter the first compartment via the first inlet port and exit the first compartment via the outlet port; and at least one gas disposed within the second compartment, the at least one gas being selected from the group consisting of xenon, sulfur hexafluoride, and mixtures thereof, wherein the fluoropolymer of the at least one fluoropolymer layer is selected from the group consisting of polyvinylidene fluoride (PVDF), polyvinyl fluoride (PVF), fluorinated ethylene propylene (FEP), perfluoroalkoxy (PFA), polytetrafluoroethylene (PTFE), polychlorotrifluoroethylene (PCTFE), and ethylene tetrafluoroethylene (ETFE), wherein the diaphragm has a thickness of 10 µm to 500 µm, and wherein the fluoropolymer of the at least one fluoropolymer layer, the at least one gas, and the thickness of the diaphragm are selected such that a gas transmittance rate of the at least one gas through the diaphragm is from 0 mbar*L/second to $1*10^{-5}$ mbar*L/second;

dispensing a portion of the formable liquid onto a substrate;

forming a pattern or a layer of the dispensed formable liquid on the substrate; and processing the formed pattern or layer to make the article.

\* \* \* \* \*